United States Patent
Lee

(10) Patent No.: US 12,218,661 B1
(45) Date of Patent: Feb. 4, 2025

(54) DRIVER CIRCUIT OF DISPLAY DEVICE

(71) Applicant: INTEGRATED SOLUTIONS TECHNOLOGY INC., Taipei (TW)

(72) Inventor: Wei-Te Lee, Taipei (TW)

(73) Assignee: INTEGRATED SOLUTIONS TECHNOLOGY INC., Taipei (TW)

( * ) Notice: Subject to any disclaimer, the term of this patent is extended or adjusted under 35 U.S.C. 154(b) by 0 days.

(21) Appl. No.: 18/485,327

(22) Filed: Oct. 12, 2023

(30) Foreign Application Priority Data

Aug. 2, 2023 (TW) .................. 112128976

(51) Int. Cl.
*H03K 17/687* (2006.01)
*G09G 3/20* (2006.01)
*G09G 3/34* (2006.01)

(52) U.S. Cl.
CPC .......... *H03K 17/6871* (2013.01); *G09G 3/20* (2013.01); *G09G 3/2011* (2013.01); *G09G 3/344* (2013.01); *G09G 2310/0275* (2013.01); *G09G 2310/06* (2013.01); *G09G 2310/068* (2013.01); *H03K 2217/0063* (2013.01); *H03K 2217/0072* (2013.01)

(58) Field of Classification Search
CPC ....... H03K 17/6871; H03K 2217/0063; H03K 2217/0072; G09G 3/20; G09G 3/344; G09G 3/2011; G09G 2310/0275; G09G 2310/06; G09G 2310/068
See application file for complete search history.

(56) References Cited

U.S. PATENT DOCUMENTS

2007/0171187 A1\* 7/2007 Saito ............... G09G 3/344
345/107
2023/0040950 A1 2/2023 Umezaki

FOREIGN PATENT DOCUMENTS

TW I284312 B 7/2007
TW 202107431 A 2/2021

\* cited by examiner

*Primary Examiner* — Douglas M Wilson
(74) *Attorney, Agent, or Firm* — Li & Cai Intellectual Property Office

(57) ABSTRACT

A driver circuit of a display device is provided. The driver circuit includes a high-side transistor, a high-side voltage drop suppressor circuit, a low-side transistor, a low-side voltage drop suppressor circuit and a control circuit. When the driver circuit supplies power supplies power generated from a high-side input voltage, the control circuit turns on the high-side voltage drop suppressor circuit for reducing a voltage drop across a first terminal and a second terminal of the high-side transistor. When the driver circuit supplies power generated from a low-side input voltage, the control circuit turns on the low-side voltage drop suppressor circuit for reducing a voltage drop across a first terminal and a second terminal of the low-side transistor.

17 Claims, 10 Drawing Sheets

DRIVER CIRCUIT OF DISPLAY DEVICE

CROSS-REFERENCE TO RELATED PATENT APPLICATION

This application claims the benefit of priority to Taiwan Patent Application No. 112128976, filed on Aug. 2, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display device, and more particularly to a driver circuit of a display device.

BACKGROUND OF THE DISCLOSURE

With the advancement of science and technology, manufacturing processes of display devices are continuously developed, such as to allow display devices to become widely used in people's daily lives. In particular, electronic paper display devices have low power consumption characteristics. With a demand for colorization of the electronic paper display devices, high driving voltages are often required to bring out optical properties of the electronic paper display devices. Therefore, transistors having high withstand voltages need to be disposed in the electronic paper display devices, which causes an increase in circuit costs. Furthermore, few manufacturing processes are capable of producing the transistors having the high withstand voltages for the electronic paper display devices.

SUMMARY OF THE DISCLOSURE

In response to the above-referenced technical inadequacies, the present disclosure provides a driver circuit of a display device. The driver circuit includes a high-side transistor, a high-side voltage drop suppressor circuit, a low-side voltage drop suppressor circuit, a low-side transistor and a control circuit. A first terminal of the high-side transistor is coupled to a high-side input voltage. A first terminal of the high-side voltage drop suppressor circuit is connected to a second terminal of the high-side transistor. A second terminal of the high-side voltage drop suppressor circuit is connected to an output terminal of the driver circuit of the display device. A second terminal of the low-side voltage drop suppressor circuit is connected to the output terminal of the driver circuit of the display device and the second terminal of the high-side voltage drop suppressor circuit. A first terminal of the low-side transistor is coupled to a low-side input voltage. A second terminal of the low-side transistor is connected to a first terminal of the low-side voltage drop suppressor circuit. The control circuit is connected to a control terminal of the high-side transistor, a control terminal of the high-side voltage drop suppressor circuit, a control terminal of the low-side voltage drop suppressor circuit and a control terminal of the low-side transistor. When the output terminal of the driver circuit of the display device supplies power generated from the high-side input voltage, the control circuit turns on the high-side transistor and the high-side voltage drop suppressor circuit, such that a voltage drop between the high-side input voltage and the output terminal of the driver circuit of the display device are divided into two voltages that are withstood respectively by the high-side transistor and the high-side voltage drop suppressor circuit. When the output terminal of the driver circuit of the display device supplies power generated from the low-side input voltage, the control circuit turns on the low-side transistor and the low-side voltage drop suppressor circuit, such that a voltage drop between the low-side input voltage and the output terminal of the driver circuit of the display device are divided into two voltages that are withstood respectively by the low-side transistor and the low-side voltage drop suppressor circuit.

In one of the possible or preferred embodiments, the high-side voltage drop suppressor circuit includes at least one transistor as at least one high-side suppression transistor.

In one of the possible or preferred embodiments the control circuit outputs a high-side control signal to the control terminal of the high-side transistor, and modulates a voltage of the high-side control signal between the high-side input voltage and a high-side modulation voltage.

In one of the possible or preferred embodiments the control circuit outputs the high-side modulation voltage to a control terminal of the at least one high-side suppression transistor.

In one of the possible or preferred embodiments the driver circuit of the display device includes a high-side voltage modulating circuit. A first terminal of the high-side voltage modulating circuit is connected to a high-side voltage source. A second terminal of the high-side voltage modulating circuit is connected to a high-side node between the second terminal of the high-side transistor and a first terminal of the at least one high-side suppression transistor. When the output terminal of the driver circuit of the display device supplies power generated from the low-side input voltage, the control circuit controls the high-side voltage modulating circuit to use a voltage supplied by the high-side voltage source to reduce a voltage of the high-side node between the second terminal of the high-side transistor and the first terminal of the at least one high-side suppression transistor.

In one of the possible or preferred embodiments the voltage that is received from the high-side voltage source by the high-side voltage modulating circuit is equal to the high-side modulation voltage.

In one of the possible or preferred embodiments the high-side voltage modulating circuit includes a transistor as a high-side modulating transistor. A control terminal of the high-side modulating transistor is connected to the control circuit. When the output terminal of the driver circuit of the display device supplies power generated from the high-side input voltage, the control circuit turns off the high-side modulating transistor. When the output terminal of the driver circuit of the display device supplies power generated from the low-side input voltage, the control circuit controls the high-side modulating transistor to use the voltage supplied by the high-side voltage source to reduce the voltage of the high-side node between the second terminal of the high-side transistor and the first terminal of the at least one high-side suppression transistor.

In one of the possible or preferred embodiments the high-side voltage source is a variable voltage source.

In one of the possible or preferred embodiments the control circuit outputs the high-side control signal to the control terminal of the high-side modulating transistor. A first terminal of the high-side modulating transistor receives the high-side modulation voltage from the high-side voltage source.

In one of the possible or preferred embodiments the high-side voltage modulating circuit includes a plurality of transistors as a plurality of high-side modulating transistors. First terminals of the plurality of high-side modulating transistors are connected to a plurality of high-side voltage sources that supply different modulation voltages respectively. A second terminal of each of the plurality of high-side modulating transistors is connected to the high-side node between the second terminal of the high-side transistor and the first terminal of the at least one high-side suppression transistor. A control terminal of each of the plurality of high-side modulating transistors is connected to the control circuit.

In one of the possible or preferred embodiments the low-side voltage drop suppressor circuit includes at least one transistor as at least one low-side suppression transistor.

In one of the possible or preferred embodiments the control circuit outputs a low-side control signal to the control terminal of the low-side transistor, and modulates a voltage of the low-side control signal between the low-side input voltage and a low-side modulation voltage.

In one of the possible or preferred embodiments the control circuit outputs the low-side modulation voltage to a control terminal of the at least one low-side suppression transistor.

In one of the possible or preferred embodiments the driver circuit of the display device further includes a low-side voltage modulating circuit. A first terminal of the low-side voltage modulating circuit is connected to a low-side voltage source. A second terminal of the low-side voltage modulating circuit is connected to a low-side node between the second terminal of the low-side transistor and a first terminal of the at least one low-side suppression transistor. When the output terminal of the driver circuit of the display device supplies power generated from the high-side input voltage, the control circuit controls the low-side voltage modulating circuit to use a voltage supplied by the low-side voltage source to increase a voltage of the low-side node between the second terminal of the low-side transistor and the first terminal of the at least one low-side suppression transistor.

In one of the possible or preferred embodiments the voltage that is received from the low-side voltage source by the low-side voltage modulating circuit is equal to the low-side modulation voltage.

In one of the possible or preferred embodiments the low-side voltage modulating circuit includes a transistor as a low-side modulating transistor. A control terminal of the low-side modulating transistor is connected to the control circuit. When the output terminal of the driver circuit of the display device supplies power generated from the low-side input voltage, the control circuit turns off the low-side modulating transistor. When the output terminal of the driver circuit of the display device supplies power generated from the high-side input voltage, the control circuit controls the low-side modulating transistor to use the voltage supplied by the low-side voltage source to increase the voltage of the low-side node between the second terminal of the low-side transistor and the first terminal of the at least one low-side suppression transistor.

In one of the possible or preferred embodiments the low-side voltage source is a variable voltage source.

In one of the possible or preferred embodiments the control circuit outputs the low-side control signal to the control terminal of the low-side modulating transistor. A second terminal of the low-side modulating transistor receives the low-side modulation voltage from the low-side voltage source.

In one of the possible or preferred embodiments the low-side voltage modulating circuit includes a plurality of transistors as a plurality of low-side modulating transistors. A first terminal of each of the plurality of low-side modulating transistors is connected to the low-side node between the second terminal of the low-side transistor and the first terminal of the at least one low-side suppression transistor. Second terminals of the plurality of low-side modulating transistors are connected to a plurality of low-side voltage sources that supply different modulation voltages respectively. A control terminal of each of the plurality of low-side modulating transistors is connected to the control circuit.

As described above, in the driver circuit of the display device of the present disclosure, the voltage drop suppressor circuits (and the voltage modulating circuits) are disposed for reducing the voltage drop across the first terminal and the second terminal of the transistors. As a result, the transistors of the driver circuit of the display device of the present disclosure are prevented from being damaged to cause abnormalities to the operations of the driver circuit of the display device (such as, but not limited to, the electronic paper) due to overvoltage. Therefore, only the transistors having the low withstand voltages instead of the high withstand voltages need to be disposed in the driver circuit of the display device of the present disclosure, thereby reducing circuit costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
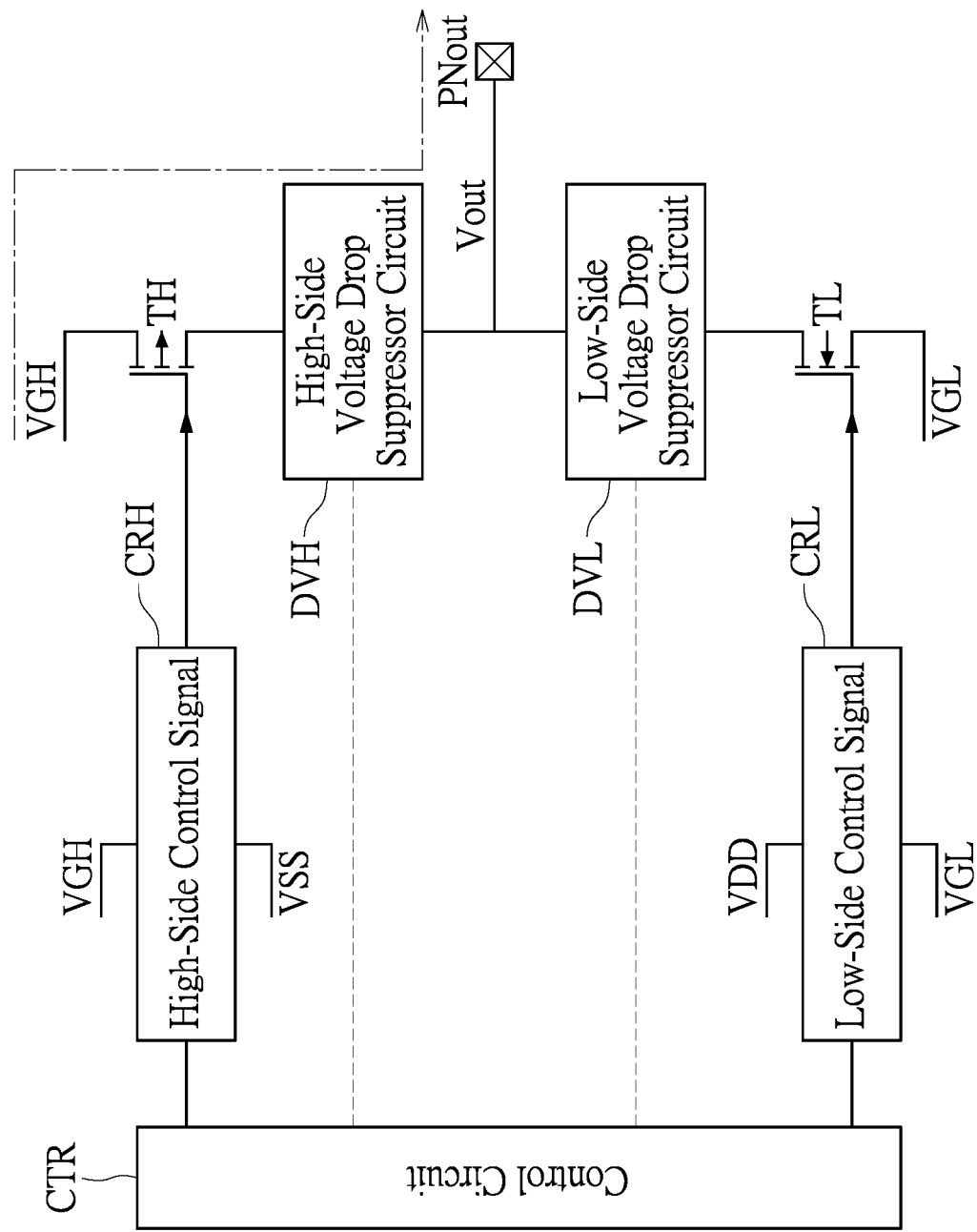
FIG. 1 is a schematic diagram of a driver circuit of a display device supplying power generated from a high-side input voltage according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIGS. 1 to 4, in which FIG. 1 is a schematic diagram of a driver circuit of a display device supplying power generated from a high-side input voltage according to a first embodiment of the present disclosure.

The driver circuit of the present disclosure is applicable to the display device such as, but not limited to an electronic paper.

As shown in FIG. 1, the driver circuit of the display device of the first embodiment of the present disclosure may include a high-side transistor TH, a high-side voltage drop suppressor circuit DVH, a low-side voltage drop suppressor circuit DVL, a low-side transistor TL and a control circuit CTR.

A first terminal of the high-side transistor TH is coupled to a high-side input voltage VGH. A first terminal of the high-side voltage drop suppressor circuit DVH is connected to a second terminal of the high-side transistor TH. A second terminal of the high-side voltage drop suppressor circuit DVH is connected to an output terminal PNout of the driver circuit of the display device of the present disclosure.

A first terminal of the low-side voltage drop suppressor circuit DVL is connected to the output terminal PNout of the driver circuit of the display device of the present disclosure and the second terminal of the high-side voltage drop suppressor circuit DVH. A first terminal of the low-side transistor TL is coupled to a low-side input voltage VGL. A second terminal of the low-side transistor TL is connected to the first terminal of the low-side voltage drop suppressor circuit DVL.

The control circuit CTR is connected to a control terminal of the high-side transistor TH and a control terminal of the low-side transistor TL. The control circuit CTR is also connected to a control terminal of the high-side voltage drop suppressor circuit DVH and a control terminal of the low-side voltage drop suppressor circuit DVL.

For example, in the first embodiment of the present disclosure, the high-side transistor TH is a P-type metal oxide semiconductor field effect transistor (PMOS) and the low-side transistor TL is an N-type metal oxide semiconductor field effect transistor (NMOS), but the present disclosure is not limited thereto.

Figure 2:
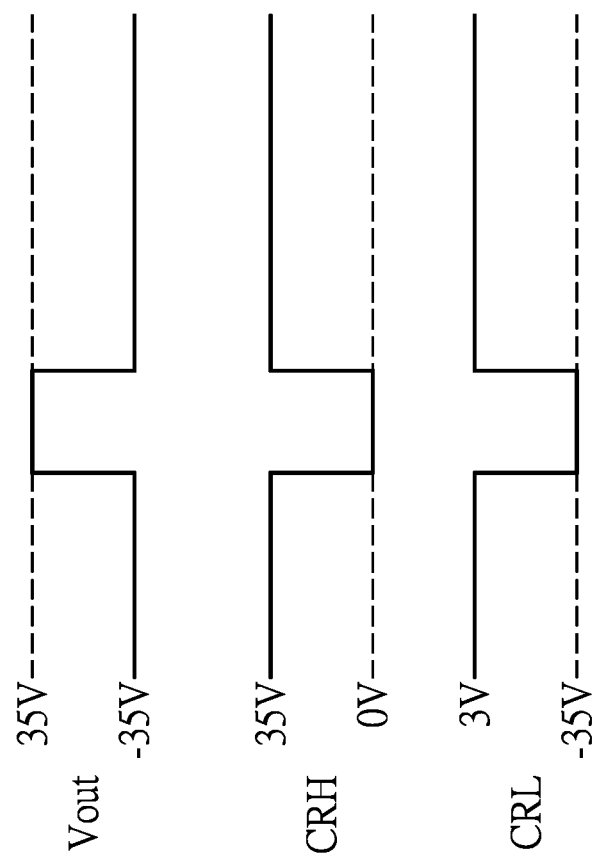
FIG. 2 is a schematic diagram of signals of the driver circuit of the display device that supplying power generated from the high-side input voltage according to the first embodiment of the present disclosure.

When the output terminal PNout of the driver circuit of the display device supplies power (such as an output voltage Vout reaching 35V as shown in FIG. 2) generated from the high-side input voltage VGH as shown in FIG. 1, the control circuit CTR outputs a high-side control signal CRH (at a low level as shown in FIG. 2) to the control terminal of the high-side transistor TH for turning on the high-side transistor TH and outputs a low-side control signal CRL (at a low level as shown in FIG. 2) to the control terminal of the low-side transistor TL for turning off the low-side transistor TL. At the same time, the control circuit CTR may output a high-side voltage drop suppressing signal to the high-side voltage drop suppressor circuit DVH for turning on and controlling an operation of the high-side voltage drop suppressor circuit DVH. At this time, the low-side voltage drop suppressor circuit DVL may be turned off.

For example, as shown in FIG. 1, the control circuit CTR modulates a voltage of the high-side control signal CRH outputted to the control terminal of the high-side transistor TH between the high-side input voltage VGH (such as 35V as shown in FIG. 2) and a high-side modulation voltage VS (such as 0V as shown in FIG. 2).

When the high-side transistor TH and the high-side voltage drop suppressor circuit DVH are turned on, a current sequentially flows through the high-side transistor TH and the high-side voltage drop suppressor circuit DVH to the output terminal PNout of the driver circuit of the display device of the present disclosure as shown in FIG. 1.

When the high-side transistor TH and the high-side voltage drop suppressor circuit DVH are turned on at the same time, a voltage drop between the high-side input voltage VGH (such as 35V) and a voltage (such as −35V) of the output terminal PNout of the driver circuit of the display device are divided into two voltages that are withstood respectively by the high-side transistor TH and the high-side voltage drop suppressor circuit DVH. As a result, a voltage drop across the first terminal and the second terminal of the high-side transistor TH is reduced to be not higher than a withstand voltage of the high-side transistor TH.

Therefore, only the high-side transistor TH having a low withstand voltage instead of a high withstand voltage needs to be disposed in the driver circuit of the display device of the present disclosure, under the condition that the driver circuit is able to supply sufficient power and the high-side transistor TH can avoid being damaged due to overvoltage.

Figure 3:
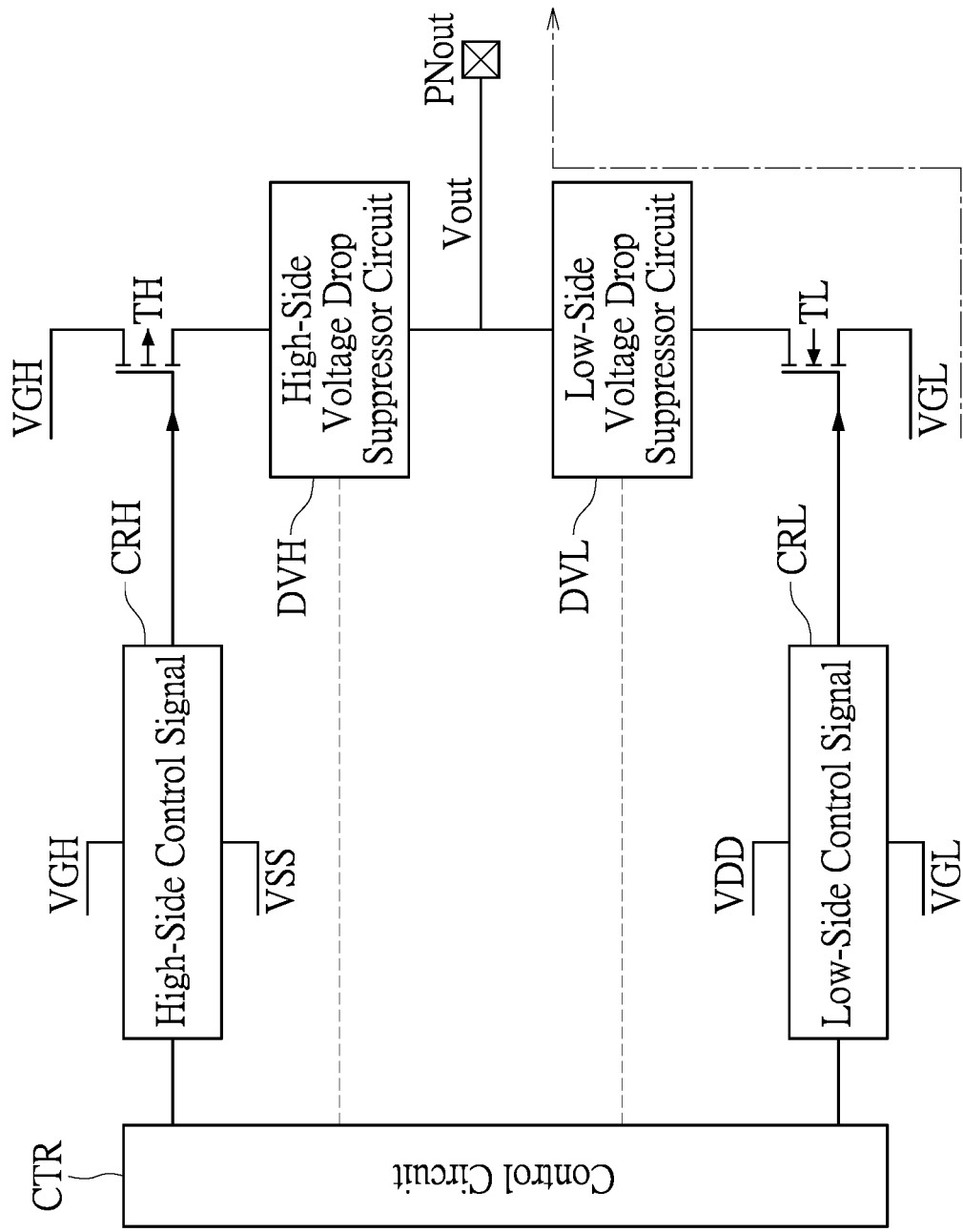
FIG. 3 is a schematic diagram of the driver circuit of the display device that supplying power generated from a low-side input voltage according to the first embodiment of the present disclosure.
Figure 4:
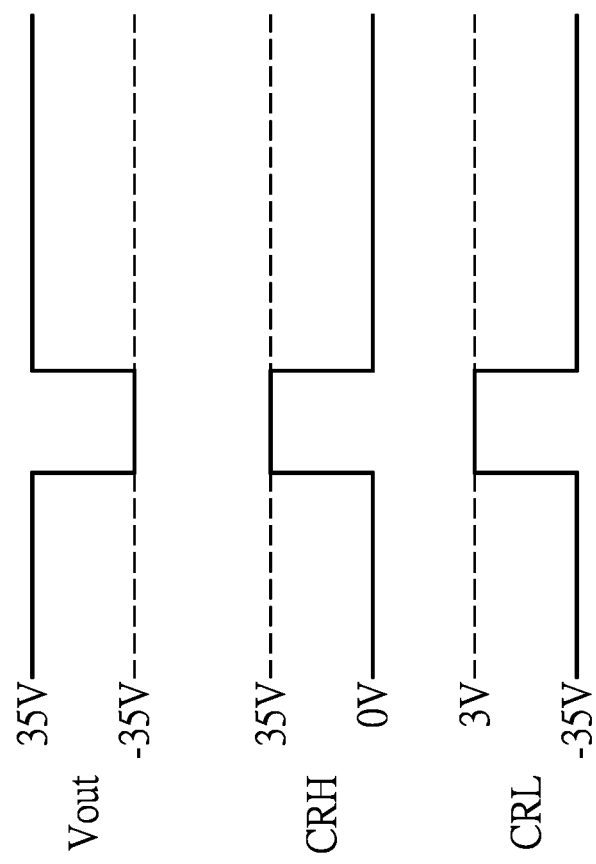
FIG. 4 is a schematic diagram of signals of the driver circuit of the display device that supplying power generated from the low-side input voltage according to the first embodiment of the present disclosure.

When the output terminal PNout of the driver circuit of the display device of the present disclosure supplies power (such as the output voltage Vout reaching −35V as shown in FIG. 4) generated from the low-side input voltage VGL as shown in FIG. 3, the control circuit CTR outputs the high-side control signal CRH (at a high level as shown in FIG. 4) to the control terminal of the high-side transistor TH for turning off the high-side transistor TH and outputs the low-side control signal CRL (at a high level as shown in FIG. 4) to the control terminal of the low-side transistor TL for turning on the low-side transistor TL. At the same time, the control circuit CTR may output the high-side voltage drop suppressing signal to the low-side voltage drop suppressor circuit DVL for controlling an operation of the low-side voltage drop suppressor circuit DVL. At this time, the high-side voltage drop suppressor circuit DVH may be turned off.

For example, as shown in FIG. 3, the control circuit CTR may modulate a voltage of the low-side control signal CRL between a low-side modulation voltage VDD (such as 3V as shown in FIG. 4) and the low-side input voltage VGL (such as −35V as shown in FIG. 4).

When the low-side transistor TL and the low-side voltage drop suppressor circuit DVL are turned on, a current sequentially flows through the low-side transistor TL and the low-side voltage drop suppressor circuit DVL to the output terminal PNout of the driver circuit of the display device of the present disclosure as shown in FIG. 3.

When the low-side transistor TL and the low-side voltage drop suppressor circuit DVL are turned on at the same time, a voltage drop between the low-side input voltage VGL (such as −35V) and a voltage (such as 35V) of the output terminal PNout of the driver circuit of the display device are divided into two voltages that are withstood respectively by the low-side transistor TL and the low-side voltage drop suppressor circuit DVL. As a result, a voltage drop across the first terminal and the second terminal of the low-side transistor TL is reduced to be not higher than a withstand voltage of the low-side transistor TL.

Therefore, only the low-side transistor TL having a low withstand voltage instead of a high withstand voltage needs to be disposed in the driver circuit of the display device of the present disclosure, under the condition that the driver circuit is able to supply sufficient power and the low-side transistor TL can avoid being damaged due to overvoltage.

Figure 5:
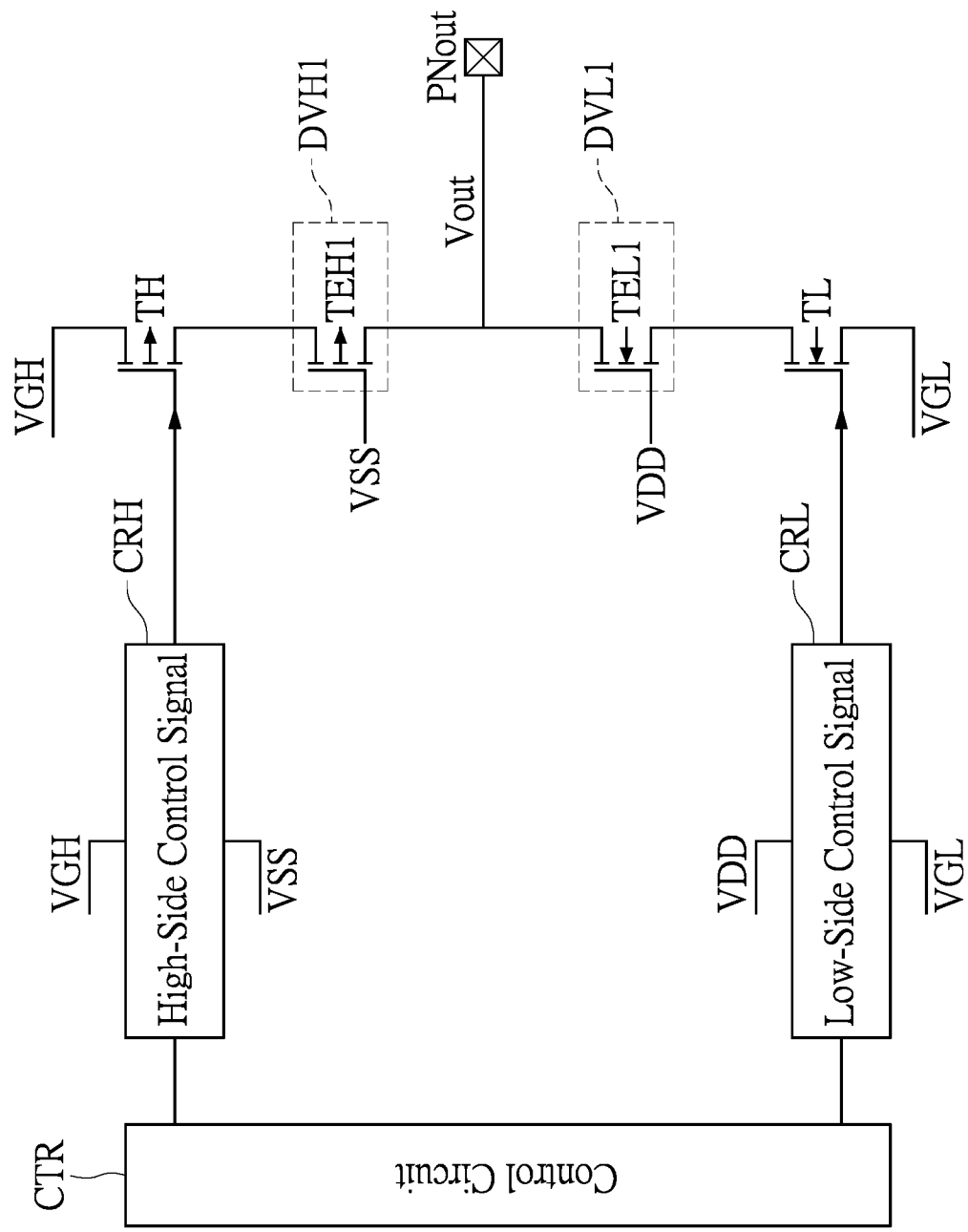
FIG. 5 is a circuit diagram of a driver circuit of a display device according to a second embodiment of the present disclosure.

Reference is made to FIG. 5, which is a circuit diagram of a driver circuit of a display device according to a second embodiment of the present disclosure. The descriptions of the second embodiment of the present disclosure that are the same as the descriptions of the first embodiment of the present disclosure are not repeated herein.

In the second embodiment of the present disclosure, a high-side voltage drop suppressor circuit DVH1 of the driver circuit of the display device of the present disclosure includes a transistor as a high-side suppression transistor TEH1 as described herein.

A first terminal of the high-side suppression transistor TEH1 is connected to the second terminal of the high-side transistor TH. A second terminal of the high-side suppression transistor TEH1 is connected to the output terminal PNout of the driver circuit of the display device of the present disclosure. A control terminal of the high-side suppression transistor TEH1 may be coupled to the high-side modulation voltage VSS, or may be connected to the control circuit CTR and receive the high-side modulation voltage VSS from the control circuit CTR.

When the output terminal PNout of the driver circuit of the display device supplies power generated from the high-side input voltage VGH, the control circuit CTR outputs the high-side control signal CRH to the control terminal of the high-side transistor TH for turning on the high-side transistor TH. At the same time, the control circuit CTR outputs the high-side voltage drop suppressing signal (having the high-side modulation voltage VSS as shown in FIG. 5) to the high-side suppression transistor TEH1 for turning on the high-side suppression transistor TEH1.

In the second embodiment of the present disclosure, a low-side voltage drop suppressor circuit DVL1 of the driver circuit of the display device of the present disclosure includes a transistor as a low-side suppression transistor TEL1.

A first terminal of the low-side suppression transistor TEL1 is connected to the output terminal PNout of the driver circuit of the display device of the present disclosure and the second terminal of the high-side suppression transistor TEH1. A second terminal of the high-side suppression transistor TEH1 is connected to the first terminal of the low-side transistor TL. A control terminal of the high-side suppression transistor TEH1 may be coupled to the low-side modulation voltage VDD, may be connected to the control circuit CTR and receive the low-side modulation voltage VDD from the control circuit CTR.

When the output terminal PNout of the driver circuit of the display device supplies power generated from the low-side input voltage VGL, the control circuit CTR outputs the low-side control signal CRL to the control terminal of the low-side transistor TL for turning on the low-side transistor TL. At the same time, the control circuit CTR outputs the low-side voltage drop suppressing signal (having the low-side modulation voltage VDD as shown in FIG. 5) to the control terminal of the low-side suppression transistor TEL1 for turning on the low-side suppression transistor TEL1.

Figure 6:
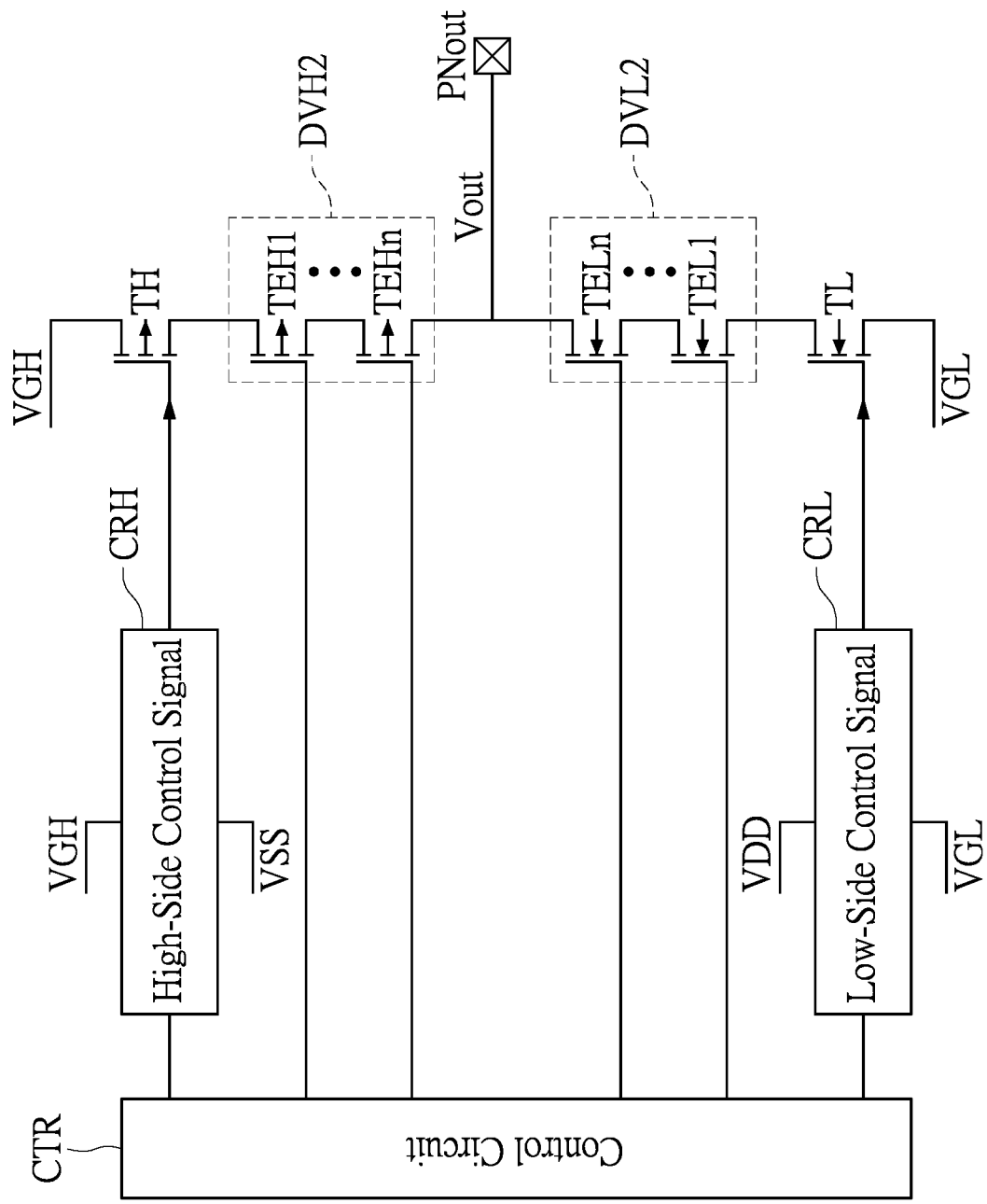
FIG. 6 is a circuit diagram of a driver circuit of a display device according to a third embodiment of the present disclosure.

Reference is made to FIG. 6, which is a circuit diagram of a driver circuit of a display device according to a third embodiment of the present disclosure. The descriptions of the third embodiment of the present disclosure that are the same as that of the first embodiment of the present disclosure are not repeated herein.

In the third embodiment of the present disclosure, a high-side voltage drop suppressor circuit DVH includes N transistors as N high-side suppression transistors TEH1 to TEHn, wherein N is an integer value being larger than 1 and may depend on the withstand voltage of the high-side transistor TH and other requirements.

The first terminal of the high-side transistor TH is coupled to the high-side input voltage VGH. The second terminal of the high-side transistor TH is connected to the first terminal of the high-side suppression transistor TEH1. The second terminal of the high-side suppression transistor TEH1 is connected to a first terminal of the high-side suppression transistor TEH2, a second terminal of the high-side suppression transistor TEH2 is connected to a first terminal of the high-side suppression transistor TEH3, and so on. A second terminal of the high-side suppression transistor TEHn is connected to the output terminal PNout of the driver circuit of the display device of the present disclosure. A control terminal of each of the high-side suppression transistors TEH1 to TEHn may be connected to the control circuit CTR and controlled by the control circuit CTR.

When the output terminal PNout of the driver circuit of the display device supplies power generated from the high-side input voltage VGH, the control circuit CTR outputs the high-side control signal CRH to the control terminal of the high-side transistor TH for turning on the high-side transistor TH. At the same time, the control circuit CTR outputs the high-side voltage drop suppressing signal to each of the high-side suppression transistors TEH1 to TEHn for turning on each of the high-side suppression transistors TEH1 to TEHn. As a result, the voltage drop across the first terminal and the second terminal of the high-side transistor TH is reduced.

In the driver circuit of the display device of the third embodiment of the present disclosure, a low-side voltage drop suppressor circuit DVL2 includes N transistors as N low-side suppression transistors TEL1 to TELn as described herein, wherein N is an integer value being larger than 1 and may depend on the withstand voltage of the low-side transistor TL and other requirements.

The first terminal of the low-side transistor TL is coupled to the low-side input voltage VGL. The second terminal of the low-side transistor TL is connected to the first terminal of the low-side suppression transistor TEL1. A second terminal of the low-side suppression transistor TEL1 is connected to a first terminal of the low-side suppression transistor TEL2, a second terminal of the low-side suppression transistor TEL2 is connected to a first terminal of the low-side suppression transistor TEL3, and so on. A second terminal of the low-side suppression transistor TELn is connected to the output terminal PNout of the driver circuit of the display device of the present disclosure and the second terminal of the high-side suppression transistor TEHn. A control terminal of each of the low-side suppression transistors TEL1 to TELn may be connected to the control circuit CTR and controlled by the control circuit CTR.

When the output terminal PNout of the driver circuit of the display device supplies power generated from the high-side input voltage VGH, the control circuit CTR outputs the low-side control signal CRL to the control terminal of the low-side transistor TL for turning on the low-side transistor TL. At the same time, the control circuit CTR outputs the low-side voltage drop suppressing signal to each of the low-side suppression transistors TEL1 to TELn for turning on each of the low-side suppression transistors TEL1 to TELn. As a result, the voltage drop across the first terminal and the second terminal of the low-side transistor TL is reduced.

Figure 7:
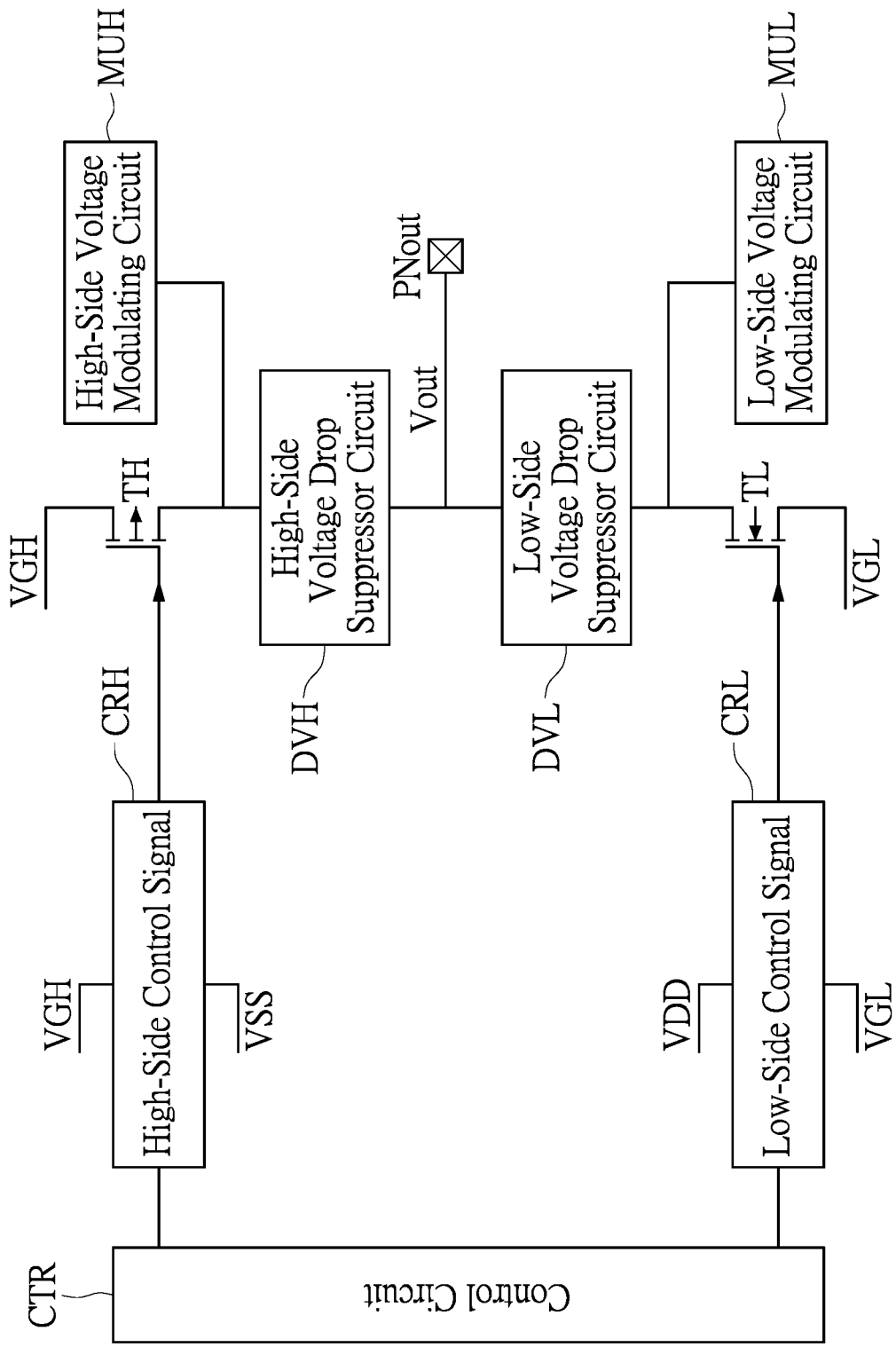
FIG. 7 is a circuit diagram of a driver circuit of a display device according to a fourth embodiment of the present disclosure.

Reference is made to FIG. 7, which is a circuit diagram of a driver circuit of a display device according to a fourth embodiment of the present disclosure. The descriptions of the fourth embodiment of the present disclosure that are the same as the descriptions of the first embodiment of the present disclosure are not repeated herein.

The driver circuit of the display device of the fourth embodiment of the present disclosure may further include a high-side voltage modulating circuit MUH.

A first terminal of the high-side voltage modulating circuit MUH may be connected to a high-side voltage source. A voltage that is received from the high-side voltage source by the high-side voltage modulating circuit MUH may be equal to the high-side modulation voltage VSS. The first terminal of the high-side voltage modulating circuit MUH may be coupled to the high-side modulation voltage VSS.

A second terminal of the high-side voltage modulating circuit MUH is connected to a high-side node between the second terminal of the high-side transistor TH and the first terminal of the high-side suppression transistor TEH1.

When the output terminal PNout of the driver circuit of the display device supplies power generated from the low-side input voltage VGL, the control circuit CTR controls the high-side voltage modulating circuit MUH to use the voltage (such as the high-side modulation voltage VSS) supplied by the high-side voltage source to reduce a voltage of the high-side node between the second terminal of the high-side transistor TH and the first terminal of the high-side voltage drop suppressor circuit DVH as shown in FIG. 7 (or the high-side suppression transistor TEH1 as shown in FIG. 6). As a result, the voltage drop across the first terminal and the second terminal of the low-side transistor TL is reduced. Therefore, only the low-side transistor TL having the low withstand voltage instead of the high withstand voltage needs to be disposed in the driver circuit of the display device of the present disclosure, thereby reducing circuit costs.

The driver circuit of the display device of the fourth embodiment of the present disclosure may further include a low-side voltage modulating circuit MUL.

A first terminal of the low-side voltage modulating circuit MUL may be connected to a low-side voltage source. The second terminal of the low-side voltage modulating circuit MUL is connected to a low-side node between the second terminal of the low-side transistor TL and the first terminal of the low-side suppression transistor TEL1.

When the output terminal PNout of the driver circuit of the display device supplies power generated from the high-side input voltage VGH, the control circuit CTR controls the low-side voltage modulating circuit MUL to use the voltage (such as the low-side modulation voltage VDD) supplied by the low-side voltage source to increase the voltage of the low-side node between the second terminal of the low-side transistor TL and the first terminal of the low-side voltage drop suppressor circuit DVL as shown in FIG. 7 (or the low-side suppression transistor TEL1 as shown in FIG. 6). As a result, the voltage drop across the first terminal and the second terminal of the high-side transistor TH is reduced. Therefore, only the high-side transistor TH having the low withstand voltage instead of the high withstand voltage needs to be disposed in the driver circuit of the display device of the present disclosure, thereby reducing circuit costs.

Figure 8:
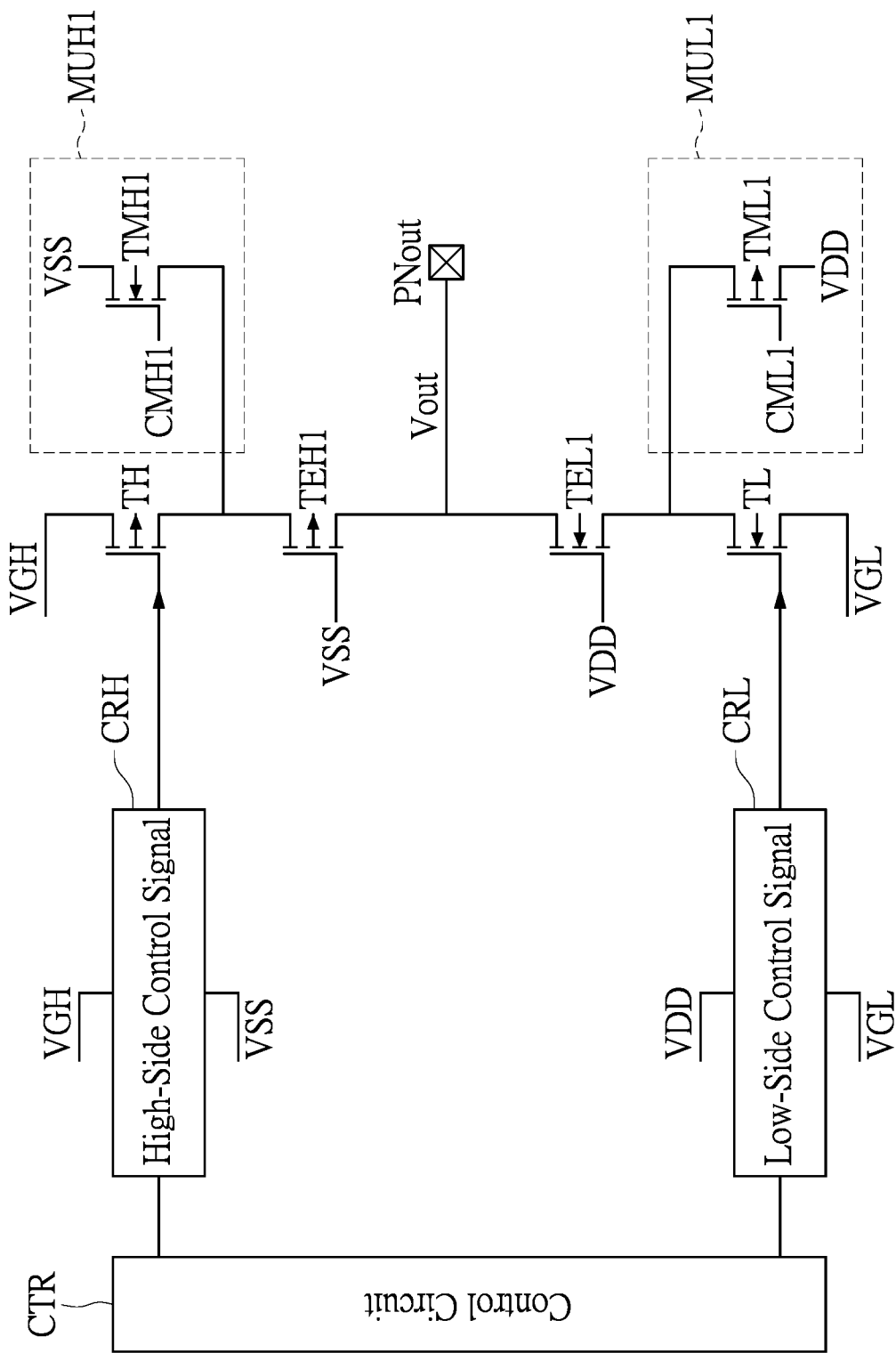
FIG. 8 is a circuit diagram of a driver circuit of a display device according to a fifth embodiment of the present disclosure.

Reference is made to FIG. 8, which is a circuit diagram of a driver circuit of a display device according to a fifth embodiment of the present disclosure. The descriptions of the fifth embodiment of the present disclosure that are the same as the descriptions of the fourth embodiment of the present disclosure are not repeated herein.

In the fifth embodiment, a high-side voltage modulating circuit MUH1 of the driver circuit of the display device of the present disclosure includes a transistor as a high-side modulating transistor TMH1 as described herein.

A first terminal of the high-side modulating transistor TMH1 is connected to the high-side voltage source and receive a modulation voltage (such as the high-side modulation voltage VSS) from the high-side voltage source, or is coupled to the modulation voltage (such as the high-side modulation voltage VSS).

A second terminal of the high-side modulating transistor TMH1 is connected to the high-side node between the second terminal of the high-side transistor TH and the first terminal of the high-side suppression transistor TEH1. A control terminal of the high-side modulating transistor TMH1 is connected to the control circuit CTR.

When the output terminal PNout of the driver circuit of the display device supplies power generated from the low-side input voltage VGL, the control circuit CTR outputs a high-side modulation signal CMH1 to the control terminal of the high-side modulating transistor TMH1 for turning on the high-side modulating transistor TMH1.

When the high-side modulating transistor TMH1 is turned on, the voltage of the high-side node between the second terminal of the high-side transistor TH and the first terminal of the high-side suppression transistor TEH1 is reduced to be equal to or approximate to a modulation voltage (such as the high-side modulation voltage VSS). At this time, the voltage drop across the first terminal and the second terminal of the low-side transistor TL is not higher than the withstand voltage of the low-side transistor TL, and a voltage drop across the first terminal and the second terminal of the low-side suppression transistor TEL1 is not higher than a withstand voltage of the low-side suppression transistor TEL1. Therefore, the low-side transistor TL and the low-side suppression transistor TEL1 are not damaged due to overvoltage.

In the fifth embodiment of the present disclosure, the high-side voltage modulating circuit MUH1 of the driver circuit of the display device of the present disclosure includes a transistor such as a low-side modulating transistor TML1 as described herein.

A first terminal of the low-side modulating transistor TML1 is connected to the low-side voltage source and receive a modulation voltage (such as the low-side modulation voltage VDD) from the low-side voltage source, or is coupled to the modulation voltage (such as the low-side modulation voltage VDD).

A second terminal of the low-side modulating transistor TML1 is connected to the low-side node between the second terminal of the low-side transistor TL and the first terminal of the low-side suppression transistor TEL1. A control terminal of the low-side suppression transistor TEL1 is connected to the control circuit CTR.

When the output terminal PNout of the driver circuit of the display device supplies power generated from the high-side input voltage VGH, the control circuit CTR outputs a low-side modulation signal CML1 to the control terminal of the low-side modulating transistor TML1 for turning on the low-side modulating transistor TML1.

When the low-side modulating transistor TML1 is turned on, the voltage of the low-side node between the second terminal of the low-side transistor TL and the first terminal of the low-side suppression transistor TEL1 is directly modulated to be equal to or approximate to the modulation voltage (such as the low-side modulation voltage VDD). At this time, the voltage drop across the first terminal and the second terminal of the high-side transistor TH is not higher than the withstand voltage of the high-side transistor TH. A voltage drop across the first terminal and the second terminal of the high-side suppression transistor TEH1 is not higher than a withstand voltage of the high-side suppression transistor TEH1. Therefore, the high-side transistor TH and the high-side suppression transistor TEH1 are not damaged due to overvoltage.

Figure 9:
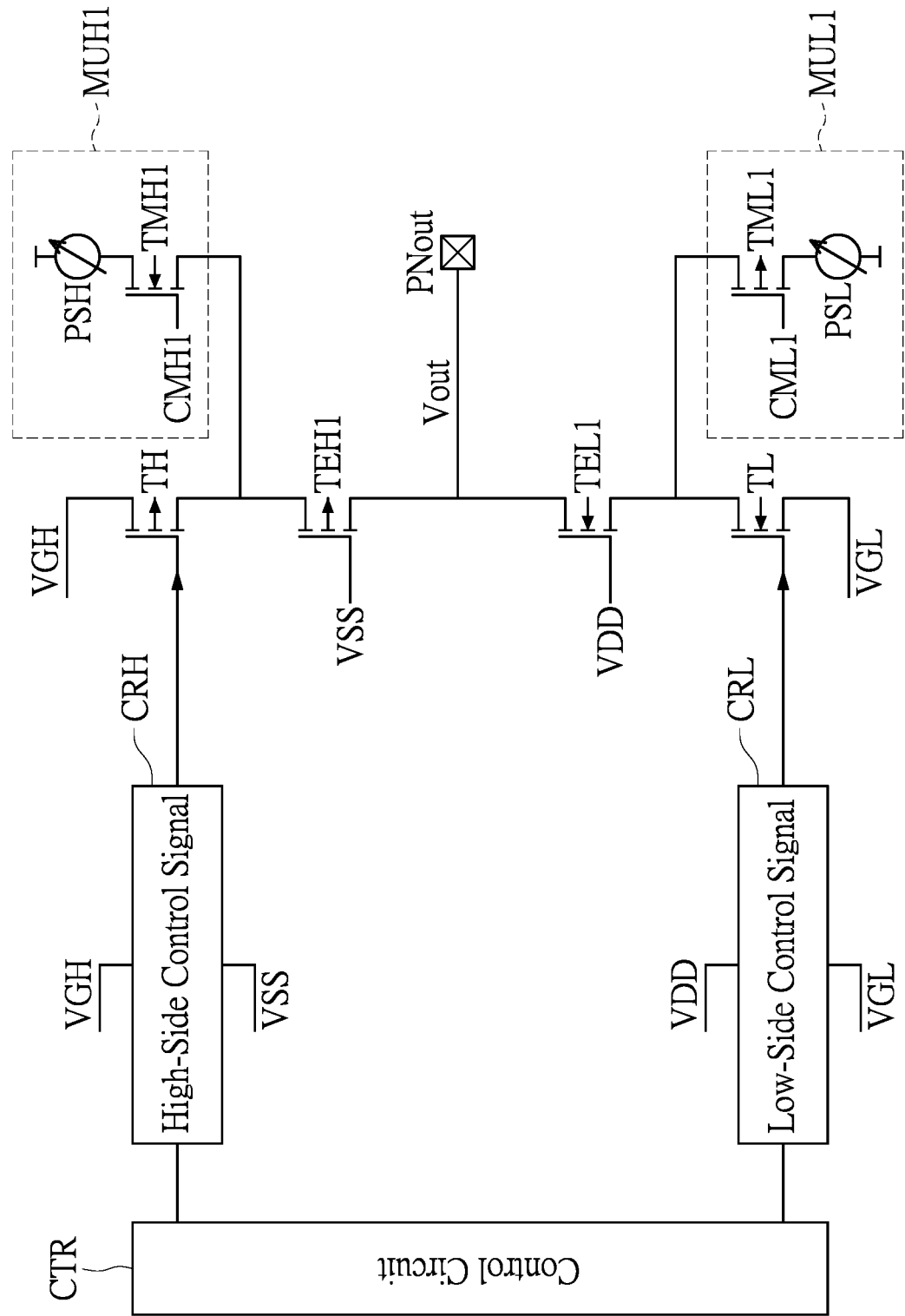
FIG. 9 is a circuit diagram of a driver circuit of a display device according to a sixth embodiment of the present disclosure.

Reference is made to FIG. 9, which is a circuit diagram of a driver circuit of a display device according to a sixth embodiment of the present disclosure. The descriptions of the sixth embodiment of the present disclosure that are the same as the descriptions of the fifth embodiment of the present disclosure are not repeated herein.

As shown in FIG. 8, in the fifth embodiment, the first terminal of the high-side modulating transistor TMH1 is coupled to the high-side modulation voltage VSS that is a constant voltage, or is connected to a constant voltage source and receives the high-side modulation voltage VSS that is the constant voltage from the constant voltage source.

As shown in FIG. 9, in the sixth embodiment, the first terminal of the high-side modulating transistor TMH1 is connected to a high-side voltage source PSH that is a variable voltage source. The high-side voltage source PSH may determine the high-side modulation voltage supplied to the first terminal of the high-side modulating transistor TMH1 according to the low-side input voltage VGL, the withstand voltage of the low-side transistor TL and other requirements. If necessary, the control circuit CTR may be connected to the high-side voltage source PSH and control the high-side voltage source PSH to supply the high-side modulation voltage to the first terminal of the high-side modulating transistor TMH1.

As shown in FIG. 8, in the fifth embodiment, the first terminal of the low-side modulating transistor TML1 is coupled to the low-side modulation voltage VDD that is a constant voltage, or is connected to a constant voltage source and receives the low-side modulation voltage VDD that is the constant voltage from the constant voltage source.

As shown in FIG. 9, in the sixth embodiment, the first terminal of the low-side suppression transistor TEL1 is connected to a low-side voltage source PSL that is a variable voltage source. The low-side voltage source PSL determines the low-side modulation voltage VDD that is supplied from the low-side voltage source PSL to the first terminal of the low-side modulating transistor TML1 according to the low-side input voltage VGL and the withstand voltage of the high-side transistor TH and other requirements. If necessary, the control circuit CTR may be connected to the low-side voltage source PSL and may control the low-side voltage source PSL to supply the low-side modulation voltage VDD to the first terminal of the low-side modulating transistor TML1.

Figure 10:
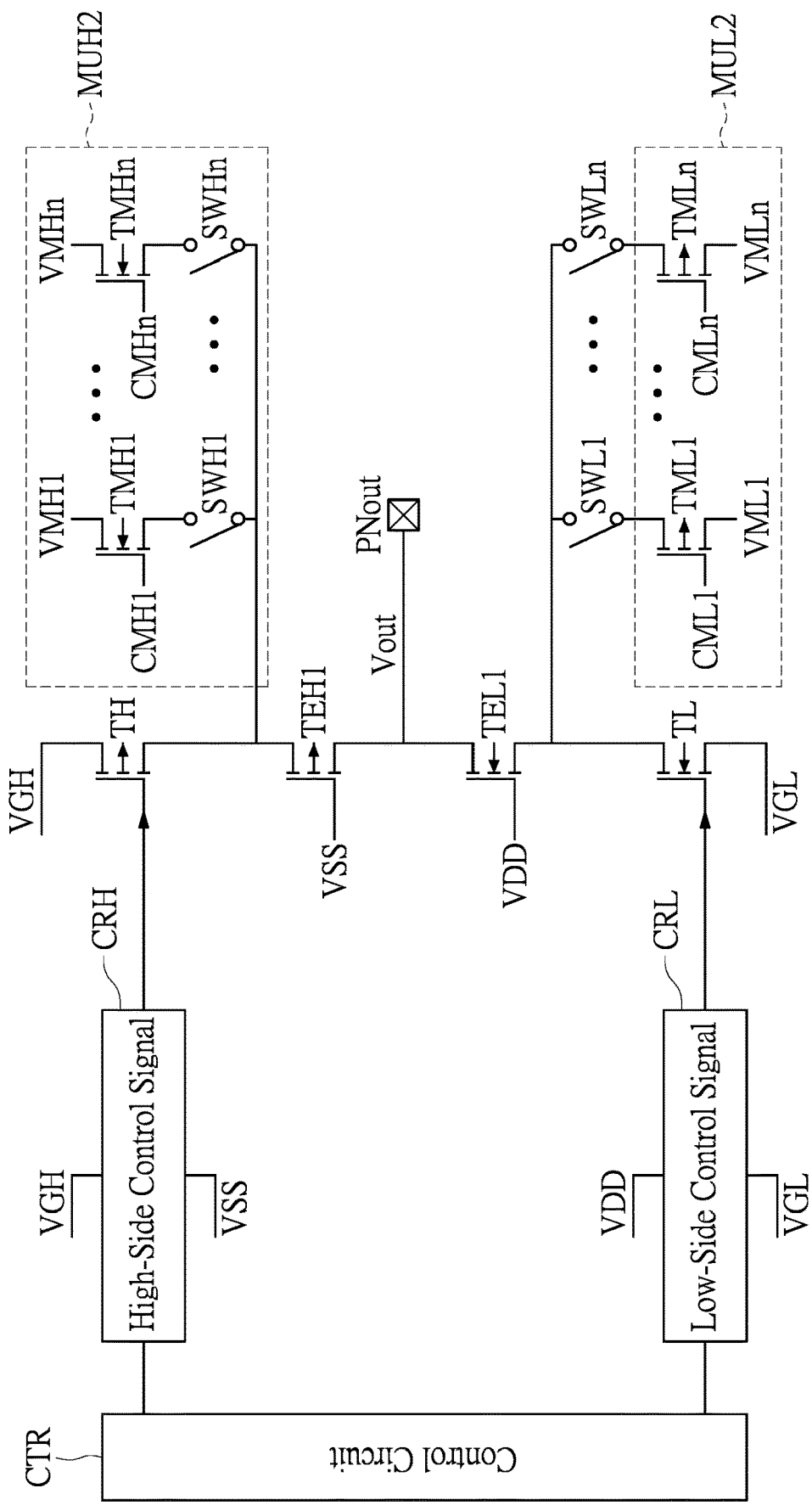
FIG. 10 is a circuit diagram of a driver circuit of a display device according to a seventh embodiment of the present disclosure.

Reference is made to FIG. 10, which is a circuit diagram of a driver circuit of a display device according to a seventh embodiment of the present disclosure. The descriptions of the seventh embodiment that are the same as the descriptions of the fifth embodiment are not repeated herein.

In the driver circuit of the display device of the seventh embodiment of the present disclosure, a high-side voltage modulating circuit MUH2 includes a plurality of high-side modulating transistors TMH1 to TMHn, and a low-side voltage modulating circuit MUL2 includes a plurality of low-side modulating transistors TML1 to TMLn.

If necessary, the driver circuit of the display device of the present disclosure may further include a plurality of high-side switching components SWH1 to SWHn and a plurality of low-side switching components SWL1 to SWLn.

First terminals of the plurality of high-side modulating transistors TMH1 to TMHn may be connected to a plurality of high-side voltage sources supplying different high-side modulation voltages VMH1 to VMHn, respectively. Second terminals of the plurality of high-side modulating transistors TMH1 to TMHn may be connected to first terminals of the plurality of high-side switching components SWH1 to SWHn respectively. A second terminal of each of the plurality of low-side switching components SWL1 to SWLn may be connected to the high-side node between the second terminal of the high-side transistor TH and the first terminal of the high-side suppression transistor TEH1.

First terminals of the plurality of low-side modulating transistors TML1 to TMLn may be connected to a plurality of low-side voltage sources supplying different low-side modulation voltages VML1 to VMLn, respectively. Second terminals of the plurality of low-side modulating transistors TML1 to TMLn may be connected to first terminals of the plurality of low-side switching components SWL1 to SWLn respectively. A second terminal of each of the plurality of low-side switching components SWL1 to SWLn may be connected to the low-side node between the second terminal of the low-side transistor TL and the first terminal of the low-side suppression transistor TEL1.

The control circuit CTR may be connected to a control terminal of each of the plurality of high-side modulating transistors TMH1 to TMHn and a control terminal of each of the plurality of low-side modulating transistors TML1 to TMLn. The control circuit CTR may output a plurality of high-side modulation signals CMH1 to CMHn respectively to the control terminals of the plurality of high-side modulating transistors TMH1 to TMHn for controlling operations of the plurality of high-side modulating transistors TMH1 to TMHn. The control circuit CTR may output a plurality of low-side modulation signals CML1 to CMLn respectively to the control terminals of the plurality of low-side modulating transistors TML1 to TMLn for controlling operations of the plurality of low-side modulating transistors TML1 to TMLn.

The control circuit CTR may be connected to the control terminal of each of the plurality of high-side switching components SWH1 to SWHn and the control terminal of each of the plurality of low-side switching components SWL1 to SWLn. The control circuit CTR may control operations of the plurality of high-side switching components SWH1 to SWHn and the plurality of low-side switching components SWL1 to SWLn.

The control circuit CTR may, according to the withstand voltage of the low-side transistor TL and other requirements, determine which one of the plurality of high-side switching components SWH1 to SWHn to turn on, so as to determine which one of the low-side modulation voltages VML1 to VMLn that the voltage of the low-side node between the second terminal of the low-side transistor TL and the first terminal of the low-side suppression transistor TEL1 is to be reduced to be equal to or approximately equal to.

The control circuit CTR may, according to the withstand voltage of the high-side transistor TH and other requirements, determine which one of the plurality of low-side switching components SWL1 to SWLn to turn on so as to determine which one of the high-side modulation voltages VMH1 to VMHn that the voltage of the high-side node between the second terminal of the high-side transistor TH and the first terminal of the high-side suppression transistor TEH1 is to be reduced to be equal to or approximately equal to.

In practice, the plurality of high-side switching components SWH1 to SWHn may be replaced with other switching components such as a multiplexer or other selector circuits, and the plurality of low-side switching components SWL1 to SWLn may also be replaced with other switching components such as a multiplexer or other selector circuits, but the present disclosure is not limited thereto.

In conclusion, in the driver circuit of the display device of the present disclosure, the voltage drop suppressor circuits (and the voltage modulating circuits) are disposed for reducing the voltage drop across the first terminal and the second terminal of the transistors. As a result, the transistors of the driver circuit of the display device of the present disclosure are prevented from being damaged to cause abnormalities to the operations of the driver circuit of the display device (such as, but not limited to, the electronic paper) due to overvoltage. Therefore, only the transistors having the low withstand voltages instead of the high withstand voltages need to be disposed in the driver circuit of the display device of the present disclosure, thereby reducing circuit costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A driver circuit of a display device, comprising:
   a high-side transistor, wherein a first terminal of the high-side transistor is coupled to a high-side input voltage;
   a high-side voltage drop suppressor circuit, wherein a first terminal of the high-side voltage drop suppressor circuit is connected to a second terminal of the high-side transistor, and a second terminal of the high-side voltage drop suppressor circuit is connected to an output terminal of the driver circuit of the display device;
   a low-side voltage drop suppressor circuit including at least one transistor as at least one low-side suppression transistor;
   a low-side transistor, wherein a first terminal of the low-side transistor is coupled to a low-side input voltage, and a second terminal of the low-side transistor is connected to a first terminal of the low-side voltage drop suppressor circuit;
   a control circuit connected to a control terminal of the high-side transistor, a control terminal of the high-side voltage drop suppressor circuit, a control terminal of the low-side voltage drop suppressor circuit, and a control terminal of the low-side transistor; and
   a low-side voltage modulating circuit, wherein a first terminal of the low-side voltage modulating circuit is connected to a low-side voltage source, a second terminal of the low-side voltage modulating circuit is connected to a low-side node between the second terminal of the low-side transistor and a first terminal of the at least one low-side suppression transistor, a second terminal of the at least one low-side suppression transistor is connected to the output terminal of the driver circuit of the display device, and a control terminal of the at least one low-side suppression transistor is connected to the control circuit;
   wherein, when the output terminal of the driver circuit of the display device supplies power generated from the high-side input voltage, the control circuit turns on the high-side transistor and the high-side voltage drop suppressor circuit, such that a voltage drop between the high-side input voltage and the output terminal of the driver circuit of the display device are divided into two voltages that are withstood respectively by the high-side transistor and the high-side voltage drop suppressor circuit;
   wherein, when the output terminal of the driver circuit of the display device supplies power generated from the low-side input voltage, the control circuit turns on the low-side transistor and the low-side voltage drop suppressor circuit, such that a voltage drop between the low-side input voltage and the output terminal of the driver circuit of the display device are divided into two voltages that are withstood respectively by the low-side transistor and the low-side voltage drop suppressor circuit;

wherein, when the output terminal of the driver circuit of the display device supplies power generated from the high-side input voltage, the control circuit controls the low-side voltage modulating circuit to use a voltage supplied by the low-side voltage source to increase a voltage of the low-side node between the second terminal of the low-side transistor and the first terminal of the at least one low-side suppression transistor.

2. The driver circuit of the display device according to claim 1, wherein the high-side voltage drop suppressor circuit includes at least one transistor as at least one high-side suppression transistor.

3. The driver circuit of the display device according to claim 2, wherein the control circuit outputs a high-side control signal to the control terminal of the high-side transistor, and modulates a voltage of the high-side control signal between the high-side input voltage and a high-side modulation voltage.

4. The driver circuit of the display device according to claim 3, wherein the control circuit outputs the high-side modulation voltage to a control terminal of the at least one high-side suppression transistor.

5. The driver circuit of the display device according to claim 4, further comprising:
a high-side voltage modulating circuit, wherein a first terminal of the high-side voltage modulating circuit is connected to a high-side voltage source, and a second terminal of the high-side voltage modulating circuit is connected to a high-side node between the second terminal of the high-side transistor and a first terminal of the at least one high-side suppression transistor;
wherein, when the output terminal of the driver circuit of the display device supplies power generated from the low-side input voltage, the control circuit controls the high-side voltage modulating circuit to use a voltage supplied by the high-side voltage source to reduce a voltage of the high-side node between the second terminal of the high-side transistor and the first terminal of the at least one high-side suppression transistor.

6. The driver circuit of the display device according to claim 5, wherein the voltage that is received from the high-side voltage source by the high-side voltage modulating circuit is equal to the high-side modulation voltage.

7. The driver circuit of the display device according to claim 5, wherein the high-side voltage modulating circuit includes a transistor as a high-side modulating transistor, and a control terminal of the high-side modulating transistor is connected to the control circuit;
wherein, when the output terminal of the driver circuit of the display device supplies power generated from the high-side input voltage, the control circuit turns off the high-side modulating transistor;
wherein, when the output terminal of the driver circuit of the display device supplies power generated from the low-side input voltage, the control circuit controls the high-side modulating transistor to use the voltage supplied by the high-side voltage source to reduce the voltage of the high-side node between the second terminal of the high-side transistor and the first terminal of the at least one high-side suppression transistor.

8. The driver circuit of the display device according to claim 7, wherein the high-side voltage source is a variable voltage source.

9. The driver circuit of the display device according to claim 7, wherein the control circuit outputs the high-side control signal to the control terminal of the high-side modulating transistor, and a first terminal of the high-side modulating transistor receives the high-side modulation voltage from the high-side voltage source.

10. The driver circuit of the display device according to claim 5, wherein the high-side voltage modulating circuit includes a plurality of transistors as a plurality of high-side modulating transistors, first terminals of the plurality of high-side modulating transistors are connected to a plurality of high-side voltage sources that supply different modulation voltages, respectively, a second terminal of each of the plurality of high-side modulating transistors is connected to the high-side node between the second terminal of the high-side transistor and the first terminal of the at least one high-side suppression transistor, and a control terminal of each of the plurality of high-side modulating transistors is connected to the control circuit.

11. The driver circuit of the display device according to claim 1, wherein the control circuit outputs a low-side control signal to the control terminal of the low-side transistor, and modulates a voltage of the low-side control signal between the low-side input voltage and the low-side modulation voltage.

12. The driver circuit of the display device according to claim 11, wherein the control circuit outputs the low-side modulation voltage to a control terminal of the at least one low-side suppression transistor.

13. The driver circuit of the display device according to claim 12, wherein the voltage that is received from the low-side voltage source by the low-side voltage modulating circuit is equal to the low-side modulation voltage.

14. The driver circuit of the display device according to claim 12, wherein the low-side voltage modulating circuit includes a transistor as a low-side modulating transistor, and a control terminal of the low-side modulating transistor is connected to the control circuit;
wherein, when the output terminal of the driver circuit of the display device supplies power generated from the low-side input voltage, the control circuit turns off the low-side modulating transistor;
wherein, when the output terminal of the driver circuit of the display device supplies power generated from the high-side input voltage, the control circuit controls the low-side modulating transistor to use the voltage supplied by the low-side voltage source to increase the voltage of the low-side node between the second terminal of the low-side transistor and the first terminal of the at least one low-side suppression transistor.

15. The driver circuit of the display device according to claim 14, wherein the low-side voltage source is a variable voltage source.

16. The driver circuit of the display device according to claim 14, wherein the control circuit outputs the low-side control signal to the control terminal of the low-side modulating transistor, and a second terminal of the low-side modulating transistor receives the low-side modulation voltage from the low-side voltage source.

17. The driver circuit of the display device according to claim 12, wherein
the low-side voltage modulating circuit includes a plurality of transistors as a plurality of low-side modulating transistors,
a first terminal of each of the plurality of low-side modulating transistors is connected to the low-side node between the second terminal of the low-side transistor and the first terminal of the at least one low-side suppression transistor, second terminals of the plurality of low-side modulating transistors are connected to a plurality of low-side voltage sources that supply different modulation voltages, respectively, and a control terminal of each of the plurality of low-side modulating transistors is connected to the control circuit.

\* \* \* \* \*